(12) United States Patent
Tseng et al.

(10) Patent No.: US 7,122,955 B2
(45) Date of Patent: Oct. 17, 2006

(54) ORGANIC ELECTROLUMINESCENT DEVICE WITH A NANOSTRUCTURED RECOVERY LAYER

(75) Inventors: Mei-Rurng Tseng, Hsinchu (TW); Jong-Min Liu, Hsinchu (TW); Juen-kai Wang, Taipei (TW); Hsien-Kuang Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 181 days.

(21) Appl. No.: 10/644,975

(22) Filed: Aug. 21, 2003

(65) Prior Publication Data

US 2005/0088078 A1   Apr. 28, 2005

(30) Foreign Application Priority Data

Jan. 28, 2003   (TW) .............................. 92101786 A

(51) Int. Cl.
*H01J 1/62* (2006.01)
*H01J 63/04* (2006.01)

(52) U.S. Cl. ...................... 313/504; 313/498; 313/506; 313/512

(58) Field of Classification Search ................ 313/498, 313/502–504, 506, 512

See application file for complete search history.

(56) References Cited

U.S. PATENT DOCUMENTS

| | | | |
|---|---|---|---|
| 5,858,564 A * | 1/1999 | Tamura et al. .............. 428/690 |
| 6,034,809 A | 3/2000 | Anemogiannis ............ 359/254 |
| 6,198,217 B1 * | 3/2001 | Suzuki et al. ............... 313/504 |
| 6,593,690 B1 * | 7/2003 | McCormick et al. ........ 313/506 |
| 2004/0140758 A1 * | 7/2004 | Raychaudhuri et al. ..... 313/504 |

* cited by examiner

*Primary Examiner*—Nimeshkumar D. Patel
*Assistant Examiner*—Kevin Quarterman
(74) *Attorney, Agent, or Firm*—Birch, Stewart, Kolasch & Birch, LLP

(57) ABSTRACT

An organic electroluminescent device. The device has an organic electroluminescent light recovery layer consisting of dielectric material and nanoscale metal particles or organic material and nanoscale metal particles. The membrane of the organic electroluminescent light recovery layer cross couples with surface plasmon resonance and recovers light trapped in the device, enhancing the light emission efficiency of the organic electroluminescent device.

30 Claims, 4 Drawing Sheets

ORGANIC ELECTROLUMINESCENT DEVICE WITH A NANOSTRUCTURED RECOVERY LAYER

This nonprovisional application claims priority under 35 U.S.C. § 119(a) on Patent Application No(s). 092101786 filed in TAIWAN, R.O.C. on Jan. 28, 2003, which is(are) herein incorporated by reference.

BACKGROUND OF THE INVENTION

1. Field of the Invention

The present invention relates to an organic electroluminescent device, and more particularly to an organic electroluminescent device solving low external quantum efficiency problems of surface plasmon resonance.

2. Description of the Related Art

Organic electroluminescent devices are also known as organic light emitting diodes (OLED). The OLED luminescent principle applies a voltage to organic molecular material or polymer material, and the device luminesces. Due to OLED's self emission characteristics, it can form a dot matrix type display with light weight, slim profile, high contrast, low power consumption, high resolution, fast response time, no need for backlighting, and full viewing angle. Possible display parameters range from 4 mm microdisplay to 100 inch outdoor billboards, making it a preferred type of flat panel display (FPD). If the OLED luminescent efficiency is over 100 Lm/W, it can replace conventional lighting.

In organic electroluminescence, electrons are propelled from a cathode layer and holes from an anode layer, and the applied electric field induces a potential difference, such that the electrons and holes move and centralize in a thin film layer, resulting in recombination. The energy of this recombination excites the luminescent layer moleculars to higher energy levels and unstable excited states, and when the energy is released, they return to lower energy levels and stable ground states. OLED luminescent efficiency depends on the internal and external quantum efficiency of the device. Internal quantum efficiency is the internal efficiency of converting electricity to light. After exciting the organic moleculars, a quarter of the excited electrons assume a single-state asymmetric spin configuration, releasing energy in the form of fluorescence. The other three-quarters assume triple-state symmetric spin configuration, and release energy in the form of phosphorescence. The triple state excited electrons also release energy in the form of phosphorescence in organometallic compounds. Therefore, OLED internal quantum efficiency depends on the excitation mechanism, and on the fluorescence or phosphorescence of luminescent material chosen.

OLED external quantum efficiency is the ratio of luminescent output from device to the luminescent from the organic layer. In a typical OLED, not all light from the organic layer can pass through the device, with more than 40% of OLED light lost to surface plasmon resonance. In addition, the organic material and the glass substrate have a higher refraction index than air, so some light is limited in the device due to total reflection, some scattering outward from the device side. Around 80% of light is dissipated in the device, making conventional OLED external quantum efficiency below 20%. In the unused device light can be recovered, the OLED external quantum efficiency improves.

SUMMARY OF THE INVENTION

Accordingly, an object of the present invention is to provide an OLED comprising a nanostructured organic electroluminescent recovery layer, with dielectric material and nanoscale metal particles. The surface plasmon resonance of OLED device is cross-coupled to the surface plasmon resonance of nanostructured film. Trapped device light is thus recovered, increasing external quantum efficiency and luminescent efficiency.

To achieve the above-mentioned object, the present invention provides an OLED with nanostructured organic electroluminescent recovery layer, having at least one layer formed with dielectric material and nanoscale metal particles, or with organic material and nanoscale metal particles.

The OLED with the nanostructured organic electroluminescent recovery layer of the present invention comprises at least a substrate with a first electrode formed thereon, an organic luminescent layer on the first electrode, a second electrode on the organic luminescent layer and at least one nanostructured organic electroluminescent recovery layer. The organic luminescent layer is between the first electrode and the second electrode. The nanostructured organic electroluminescent recovery layer is between the substrate and the first electrode, the first electrode and the organic luminescent layer, the organic luminescent layer and the second electrode, or on the second electrode.

If a second nanostructured organic electroluminescent recovery layer is present, it is disposed between the organic luminescent layer and the second electrode or on the second electrode.

The OLED with the nanostructured organic electroluminescent recovery layer of the present invention is substrate side emitting, top emitting (the second electrode side) or two-side emitting.

The present invention's nanostructured organic electroluminescent recovery layer for the OLED is formed with dielectric material and nanoscale metal particles, or organic material and nanoscale metal particles. The dielectric or organic material and the nanoscale metal particles are formed at the same time using the same or different methods, and the nanoscale metal particles are doped into the dielectric or organic material. The dielectric material comprises silicon oxide, aluminum oxide, magnesium oxide, silicon nitride, aluminum nitride or magnesium fluoride. The organic material is molecular or polymer. The nanoscale metal particles comprise Au, Ag, Ge, Se, Sn, Sb, te, Ga or combinations thereof.

The substrate of the present invention is transparent or opaque glass or plastic. The plastic substrate is polyethyleneterephthalate, polyester, polycarbonate, polyimide, Arton, polyacrylate or polystyrene.

The OLED organic luminescent layer of the present invention comprises molecular organic luminescent material and polymer organic luminescent material. The organic luminescent layer is formed with a single organic luminescent layer or stacked organic luminescent layers, and the organic luminescent layer is fluorescent or phosphorescent luminescent material.

The first electrode and the second electrode are transparent, metal, or complex. The transparent electrode comprises ITO, IZO, AZO or ZnO, the metal electrode Li, Mg, Ca, Al, Ag, In, Au, Ni, Pt, or alloys thereof, and the complex electrode Li, Mg, Ca, Al, Ag, In, Au, Ni, Pt, ITO, IZO, AZO or ZnO.

According to OLED of the present invention, the nanostructured organic electroluminescent recovery layer is formed with nanoscale metal particles, wherein the surface plasmon resonance of OLED device is cross-coupled to the surface plasmon resonance of nanostructured film. Trapped light is thus recovered. A nanostructured organic electroluminescent recovery layer on the device thereby improves the OLED luminescent efficiency.

DESCRIPTION OF THE DRAWINGS

For a better understanding of the present invention, reference is made to a detailed description to be read in conjunction with the accompanying drawings, in which.

Figure 1:
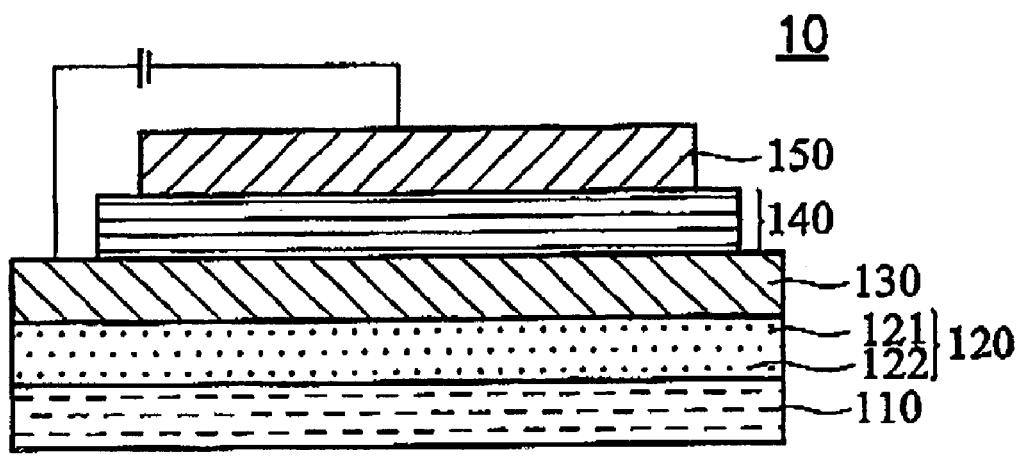
FIG. 1 is a cross-section showing the OLED according to the first embodiment of the present invention.
Figure 2:
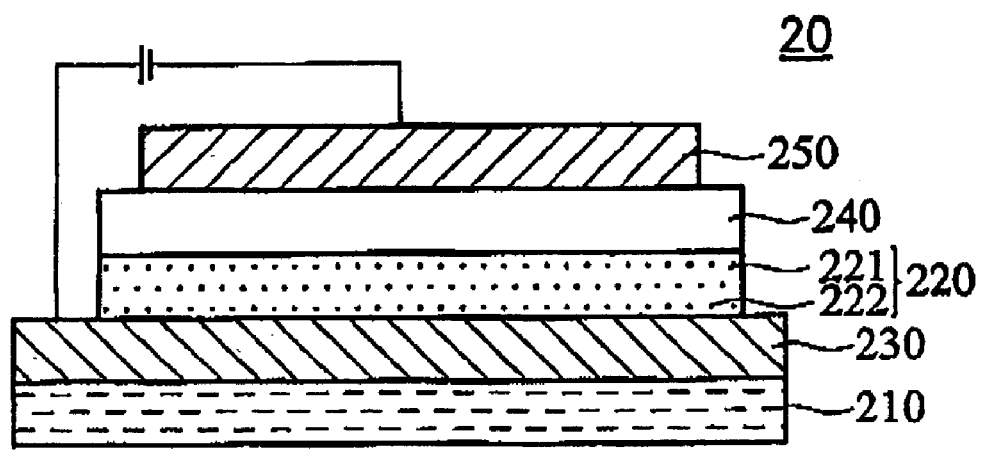
FIG. 2 is a cross-section showing the OLED according to the second embodiment of the present invention.
Figure 3:
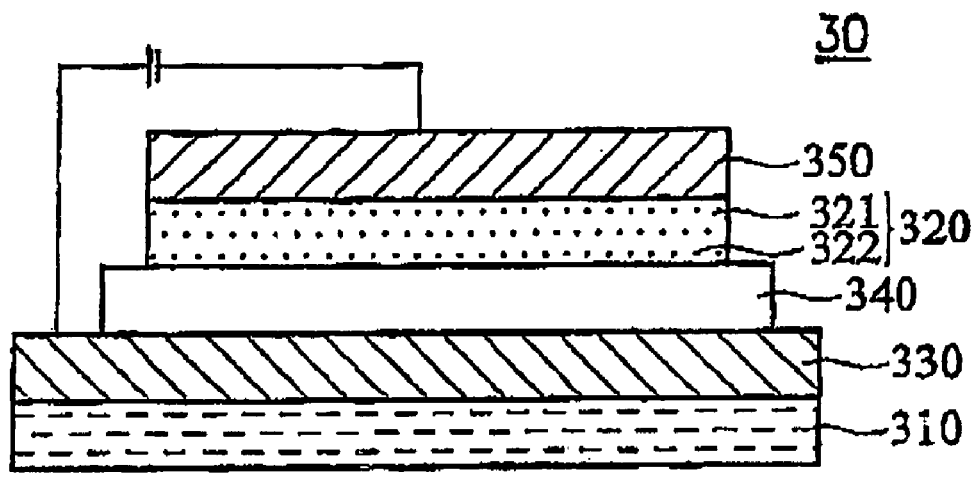
FIG. 3 is a cross-section showing the OLED according to the third embodiment of the present invention.
Figure 4:
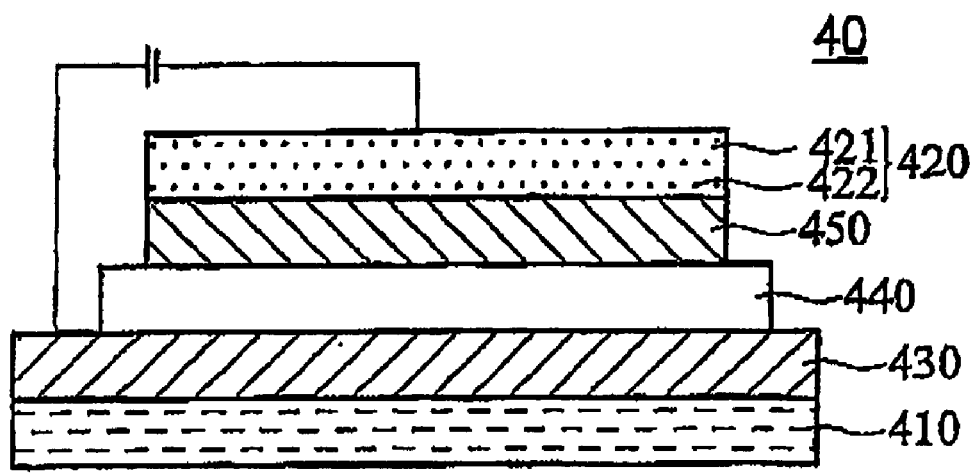
FIG. 4 is a cross-section showing the OLED according to the fourth embodiment of the present invention.
Figure 5:
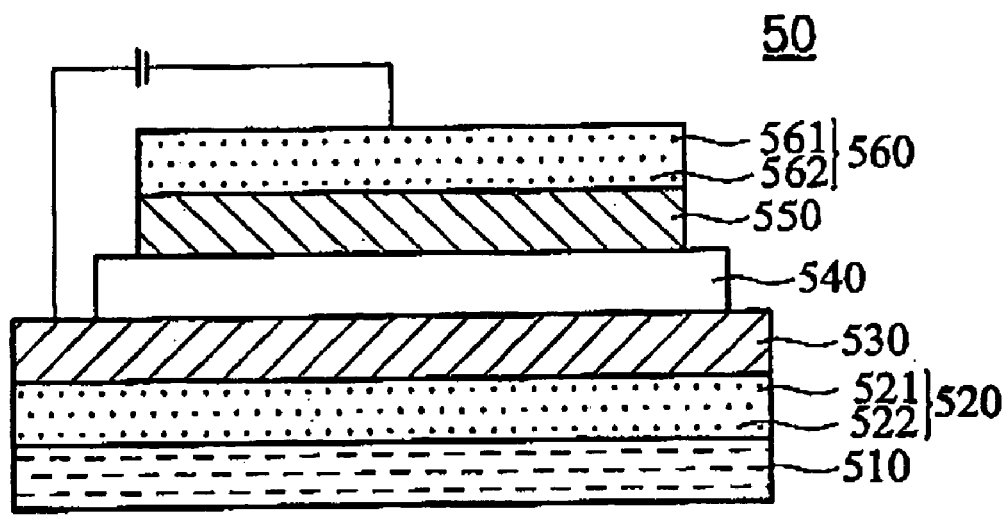
FIGS. 5–8 illustrate a cross-sectional view of the OLED according to the fifth embodiment of the present invention.
Figure 6:
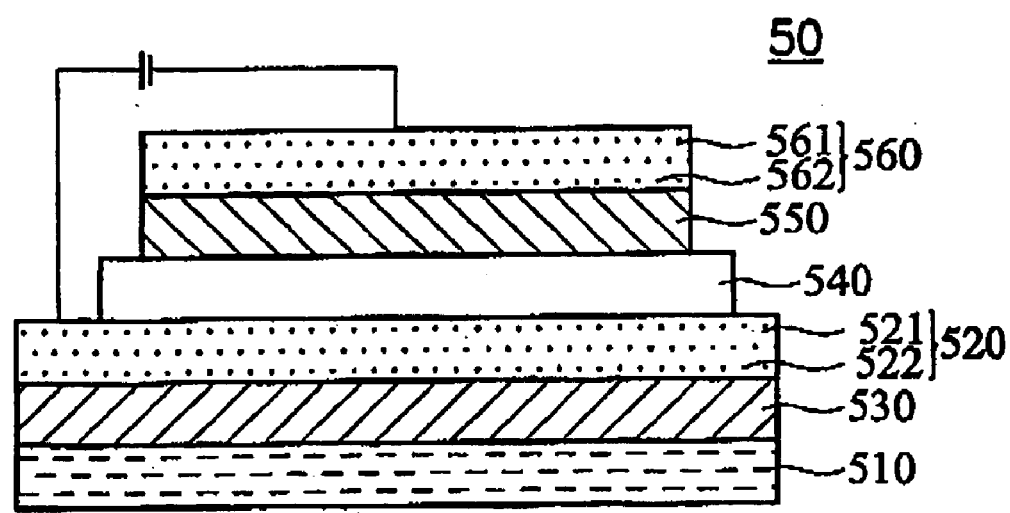
Figure 7:
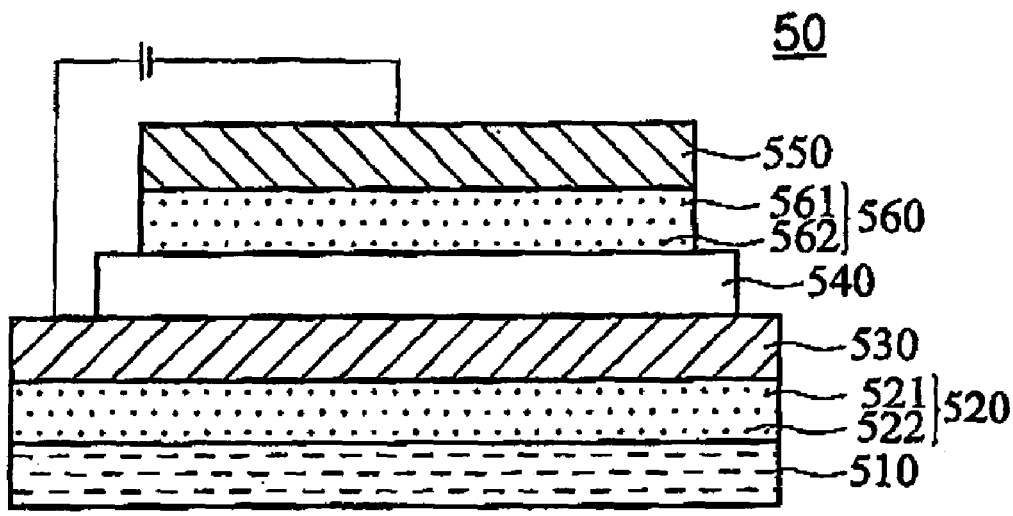
Figure 8:
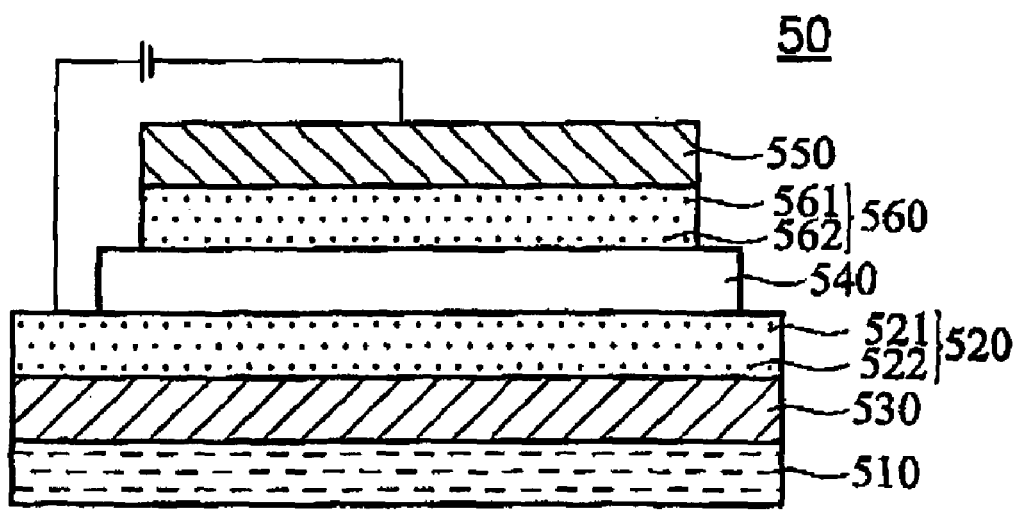

REFERENCE NUMERALS IN THE DRAWINGS 10, 20, 30, 40 and 50 OLED
110, 210, 310, 410 and 510 substrate
120, 220, 320 and 420 nanostrctured organic electroluminescent recovery layer
121, 221, 321, 421, 521 and 561 dielectric material
122, 222, 322, 422, 522 and 562 nanoscale metal particles
130, 230, 330, 430 and 530 first electrode
140, 240, 340, 440 and 540 organic luminescent layer
150, 250, 350, 450 and 550 second electrode
520 first nanostrctured organic electroluminescent recovery layer
560 second nanostrctured organic electroluminescent recovery layer.

DETAILED DESCRIPTION OF THE INVENTION

In order to understand the above and other objects, characteristics and advantages, six preferred embodiments of the present invention are now detailed described with reference to the attached figures.

The embodiments are designed to accommodate a wide range of possible device structures, enabling broader application of the inventive benefits.

The OLED of the present invention comprises at least a substrate, a first electrode, an organic luminescent layer, a second electrode, and a nanostructured organic electroluminescent recovery layer between the substrate and the first electrode (in the first embodiment), the first electrode and the organic luminescent layer (in the second embodiment), the organic luminescent layer and the second electrode (in the third embodiment), or on the second electrode (in the fourth embodiment).

First Embodiment

First, a substrate 110 is provided as FIG. 1, transparent or opaque, formed with glass or plastic (flexible) material.

Nanostructured organic electroluminescent recovery layer 120 is formed with dielectric or organic material 121 and nanoscale metal particles 122 on the substrate 121. The dielectric or organic material 121 and the nanoscale metal particles 122 are formed at the same time using the same or different methods. The nanoscale metal particles 122 are doped into the dielectric or organic material 121. The dielectric material for the nanostructured organic electroluminescent recovery layer is silicon oxide, aluminum oxide, magnesium oxide, silicon nitride, aluminum nitride or magnesium fluoride, and is formed by sputtering or plasmon enhanced chemical vapor deposition. The organic material for the nanostructured organic electroluminescent recovery layer is molecular or polymer organic material, formed by thermal evaporation, spin coating, ink jet, or screen printing. The nanoscale metal particles comprise Au, Ag, Al, Ge, Se, Sn, Sb, te, Ga or combinations thereof, formed by sputtering, electron beam evaporation, thermal evaporation, chemical vapor deposition, spin coating, ink jet, or screen printing. The ratio of the nanoscale metal particles doped in the dielectric or organic material to the combinations thereof is from 0.001 to 70 wt %. The ratio is determined by different deposition rate (power) between the dielectric material and the nanoscale metal particles or by different mixing ratio between the organic material and the nanoscale metal particles.

A first electrode 130 is formed on the nanostructured organic electroluminescent recovery layer 120, between the substrate 110 and the first electrode 130. The first electrode is transparent, metal, or complex.

An organic luminescent layer 140 is formed on the first electrode 130, of molecular or polymer organic luminescent material. The organic luminescent layer 140 may comprise a single organic luminescent layer or stacked organic luminescent layers, so as the organic luminescent layer 240, 340, 440, and 540 below. If the organic luminescent layer is molecular organic luminescent material, it can be formed by vacuum evaporation. If the organic luminescent layer is polymer organic luminescent material, it can be formed by spin coating, ink jet, or screen printing.

Finally, a second electrode 150 is formed on the organic luminescent layer 140. The second electrode 150 is transparent, metal, or complex. The first electrode 130 and the second electrode 150 are formed by sputtering, electron beam evaporation, thermal evaporation, chemical vapor deposition or spray pyrolysis.

The OLED 10 of this embodiment is substrate side emitting, top emitting (the second electrode side) or two-side emitting.

Second Embodiment

The nanostructured organic electroluminescent recovery layer 220 of this embodiment differs only from the previous embodiment in that the nanostructured organic electroluminescent recovery layer 220 is between the first electrode 230 and the organic luminescent layer 240.

Third Embodiment

The nanostructured organic electroluminescent recovery layer 320 of this embodiment differs only from the previous embodiments in that the nanostructured organic electroluminescent recovery layer 320 is between the organic luminescent layer 340 and the second electrode 350.

Fourth Embodiment

The nanostructured organic electroluminescent recovery layer 420 of this embodiment differs only from the previous embodiments in that the nanostructured organic electroluminescent recovery layer 420 is on the second electrode 450.

Fifth Embodiment

Referring to FIGS. 5–8, the nanostructure organic electroluminescent recovery layer 520 of this embodiment is the same as the first embodiment, with the OLED 50 further comprising a second nanostructured organic electroluminescent recovery layer 560 on the second electrode 550.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent device, comprising:
   a substrate;
   a first electrode on the substrate;
   an organic luminescent layer on the first electrode;
   a second electrode on the organic luminescent layer, wherein the organic luminescent layer is between the first electrode and the second electrode; and
   a nanostructured organic electroluminescent recovery layer, comprising dielectric or organic material, doped with nanoscale metal particles, wherein the nanoscale metal particle comprises Au, Ag, Ge, Se, Sn, Sb, Te, or Ga.

2. The organic electroluminescent device as claimed in claim 1, wherein the nanostructured organic electroluminescent recovery layer is on the substrate and between the substrate and the first electrode.

3. The organic electroluminescent device as claimed in claim 1, wherein the nanostructured organic electroluminescent recovery layer is on the first electrode and between the first electrode and the organic luminescent layer.

4. The organic electroluminescent device as claimed in claim 1, wherein the nanostructured organic electroluminescent recovery layer is on the organic luminescent layer and between the organic luminescent layer and the second electrode.

5. The organic electroluminescent device as claimed in claim 1, wherein the nanostructured organic electroluminescent recovery layer is on the second electrode.

6. The organic electroluminescent device as claimed in claim 1, wherein the organic luminescent layer comprises a single organic luminescent layer.

7. The organic electroluminescent device as claimed in claim 1, wherein the organic luminescent layer comprises stacked organic luminescent layers.

8. The organic electroluminescent device as claimed in claim 1, wherein the organic luminescent layer comprises fluorescent luminescent material or phosphorescent luminescent material.

9. The organic electroluminescent device as claimed in claim 1, wherein the organic luminescent layer comprises molecular organic luminescent material.

10. The organic electroluminescent device as claimed in claim 1, wherein the organic luminescent layer comprises polymer organic luminescent material.

11. The organic electroluminescent device as claimed in claim 1, wherein the substrate is transparent or opaque glass or plastic.

12. The organic electroluminescent device as claimed in claim 11, wherein the plastic substrate is selected from the group consisting of polyethyleneterephthalate, polyester, polycarbonate, polyimide, Arton, polyacrylate and polystyrene.

13. The organic electroluminescent device as claimed in claim 1, wherein the first electrode is transparent, metal, or complex.

14. The organic electroluminescent device as claimed in claim 1, wherein the second electrode is transparent, metal, or complex.

15. The organic electroluminescent device as claimed in claim 13, wherein the transparent electrode is ITO, IZO, AZO or ZnO.

16. The organic electroluminescent device as claimed in claim 14, wherein the transparent electrode is ITO, IZO, AZO or ZnO.

17. The organic electroluminescent device as claimed in claim 13, wherein the metal electrode is selected from the group consisting of Li, Mg, Ca, Al, Ag, In, Au, Ni, Pt, and alloys thereof.

18. The organic electroluminescent device as claimed in claim 14, wherein the metal electrode is selected from the group consisting of Li, Mg, Ca, Al, Ag, In, Au, Ni, Pt, and alloys thereof.

19. The organic electroluminescent device as claimed in claim 13, wherein the complex electrode comprises stacked layer electrodes of Li, Mg, Ca, Al, Ag, In, Au, Ni, Pt, ITO, IZO, AZO or ZnO.

20. The organic electroluminescent device as claimed in claim 14, wherein the complex electrode comprises stacked layer electrodes of Li, Mg, Ca, Al, Ag, In, Au, Ni, Pt, ITO, IZO, AZO or ZnO.

21. The organic electroluminescent device as claimed in claim 1, wherein the dielectric material for the nanostructured organic electroluminescent recovery layer is selected from the group consisting of silicides, oxides, carbides, nitrides and combinations thereof.

22. The organic electroluminescent device as claimed in claim 1, wherein the dielectric material for the nanostructured organic electroluminescent recovery layer is selected from the group consisting of silicon oxide, aluminum oxide, magnesium oxide, silicon nitride, aluminum nitride and magnesium fluoride.

23. The organic electroluminescent device as claimed in claim 1, wherein the dielectric material and the nanoscale metal particles for the nanostructured organic electroluminescent recovery layer are formed at the same time using the same or different methods.

24. The organic electroluminescent device as claimed in claim 1, wherein the organic material of the nanostructured organic electroluminescent recovery layer comprises molecular or polymer organic material.

25. The organic electroluminescent device as claimed in claim 1, wherein the organic material and the nanoscale metal particles for the nanostructured organic electroluminescent recovery layer are formed at the same time using the same or different methods.

26. An organic electroluminescent device, comprising:
   a substrate;
   a first electrode on the substrate;

an organic luminescent layer on the first electrode;
a second electrode on the organic luminescent layer, wherein the organic luminescent layer is between the first electrode and the second electrode;
a first nanostructured organic electroluminescent recovery layer comprising first dielectric or organic material, doped with first nanoscale metal particles; and
a second nanostructured organic electroluminescent recovery layer comprising second dielectric or organic material, doped with second nanoscale metal particles, wherein the first and second nanoscale metal particles comprise Au, Ag, Ge, Se, Sn, Sb, te, or Ga.

27. The organic electroluminescent device as claimed in claim 26, wherein the first nanostructured organic electroluminescent recovery layer is on the substrate and between the substrate and the first electrode.

28. The organic electroluminescent device as claimed in claim 26, wherein the first nanostructured organic electroluminescent recovery layer is on the first electrode and between the first electrode and the organic luminescent layer.

29. The organic electroluminescent device as claimed in claim 26, wherein the second nanostructured organic electroluminescent recovery layer is on the organic luminescent layer and between the organic luminescent layer and the second electrode.

30. The organic electroluminescent device as claimed in claim 26, wherein the second nanostructured organic electroluminescent recovery layer is on the second electrode.

* * * * *